United States Patent
Tsui et al.

[19]

[11] Patent Number: 5,960,289

[45] Date of Patent: Sep. 28, 1999

[54] METHOD FOR MAKING A DUAL-THICKNESS GATE OXIDE LAYER USING A NITRIDE/OXIDE COMPOSITE REGION

[75] Inventors: Paul G. Y. Tsui; Hsing-Huang Tseng; Navakanta Bhat, all of Austin; Ping Chen, Round Rock, all of Tex.

[73] Assignee: Motorola, Inc., Schaumburg, Ill.

[21] Appl. No.: 09/102,267

[22] Filed: Jun. 22, 1998

[51] Int. Cl.$^6$ .................................................. H01L 21/8234
[52] U.S. Cl. .......................... 438/275; 438/199; 438/299; 438/770; 438/775; 438/287
[58] Field of Search .................... 438/199, 287, 438/275, 299, 770, 775, 212, 216, 217, 187, 218, 168

[56] References Cited

U.S. PATENT DOCUMENTS

| | | | |
|---|---|---|---|
| 5,254,489 | 10/1993 | Nakata | 437/40 |
| 5,327,002 | 7/1994 | Motoyoshi | 257/380 |
| 5,464,783 | 11/1995 | Kim et al. | 437/42 |
| 5,497,021 | 3/1996 | Tada | 257/369 |
| 5,502,009 | 3/1996 | Lin | 437/239 |
| 5,576,226 | 11/1996 | Hwang | 437/24 |
| 5,716,863 | 2/1998 | Arai | 437/41 |
| 5,716,864 | 2/1998 | Abe | 437/43 |
| 5,763,922 | 6/1998 | Chau | 257/371 |
| 5,821,172 | 10/1998 | Gilmer et al. | 438/769 |

OTHER PUBLICATIONS

Hill, et al., "Low–pressure rapid . . . P–channel MOSFETs", Electron Devices, IEEE Transaction . . . , vol. 431, pp. 15–22 Jan. 96.

Chang, et al., "A Highly Manufacturable 0.25 $\mu$m Multiple–Vt Dual Gate Oxide CMOS Process for Logic/Embedded IC Foundry Technology," IEEE, 1998 Symposium on VLSI Technology Digest of Technical Papers, pp. 150–151 (1998).

Han, et al., "Electrical Characteristics and Reliability of Sub–3 nm Gate Oxides Grown on Nitrogen Implanted Silicon Substrates," IEEE, International Electron Devices Meeting, pp. 643–646 (1997).

*Primary Examiner*—Wael M. Fahmy
*Assistant Examiner*—Long Pham
*Attorney, Agent, or Firm*—Keith E. Witek

[57] ABSTRACT

A method for forming a dual gate oxide (DGO) structure begins by forming a first oxide layer (106) within active areas (110) and (112). A protection layer (108a) is then formed over the layer (106). A mask (114) is used to allow removal of the layers (106 and 108a) from the active area (110). A thermal oxidation process is then used to form a thin second oxide layer (118) within an active area (110). Conductive gate electrodes (120a and 120b) are then formed wherein the first oxide layer (106) and the protection layer (108c) are incorporated into the gate dielectric layer of an MOS transistor (122a). The transistor (122b) has a thinner gate oxide layer that excludes the protection layer (108c).

20 Claims, 6 Drawing Sheets

METHOD FOR MAKING A DUAL-THICKNESS GATE OXIDE LAYER USING A NITRIDE/OXIDE COMPOSITE REGION

FIELD OF THE INVENTION

The present invention relates generally to semiconductor manufacturing, and more particularly to, making an improved dual-thickness gate oxide layer using a nitride protection region over an oxide region.

BACKGROUND OF THE INVENTION

In the integrated circuit (IC) industry, it has become necessary to integrate dual gate oxide (DGO) thicknesses onto a single integrated circuit device. One motivation for performing dual gate oxide processing is that high performance transistors require thinner gate dielectric regions and operate at lower voltages (e.g. 1.8 volts to 2.5 volts), whereas most conventional external peripherals typically require higher operating voltages such as 3.3 volts to 5.0 volts. When interfacing lower voltage high performance MOS transistors to higher voltage devices, input and output (I/O) buffers of the integrated circuit (IC) are typically designed to contain thicker gate dielectric regions that are compatible with the higher external peripheral device voltages. In addition, current microcontroller units (MCUs) and digital signal processors (DSPs) are integrating several different types of technology onto a single integrated circuit. For example, high speed logic, power logic, static random access memory (SRAM), nonvolatile memory (NVM), embedded dynamic random access memory (DRAM), analog circuitry, and other devices and technologies are now being considered for integration onto the same integrated circuit die. Many of these devices require different gate dielectric processing and different gate dielectric thicknesses.

One method to enable the formation of two different gate oxide thicknesses in two different active areas is illustrated in FIGS. 1–4.

FIG. 1 illustrates a prior art semiconductor structure 10. Semiconductor structure 10 has a substrate 12. Trench isolation regions 14 are formed within select portions of the substrate 12. The trench isolation regions 14 separate many active areas of the substrate 12, two of which are illustrated in FIG. 1. Specifically, FIG. 1 illustrates a first active area 16 that is separated from a second active area 18 by one or more trench isolation regions 14.

FIG. 2 illustrates that at thermal oxidation process is used to form an oxide layer 20a in both the active region 16 and the active area region 18. After layer 20a is formed across the entire wafer in both active areas 16 and 18, a photoresist mask 22 is formed to protect the portion of the layer 20a lying within the active area 18. Since the layer 22 does not overlay the active area 16, any portion of the layer 20a located within the active area 16 is exposed to subsequent processing ambients. An oxide etch ambient is then used to etch the layer 20a from the top surface of the active area 16 while the layer 22 protects the underlying layer 20a from the etch ambient. Therefore, the active area 16 of FIG. 2 illustrates that the layer 20a has been removed from a top surface of the active area 16, whereas the layer 20a remains behind on the active area 18.

FIG. 3 illustrates that an $O_2$ ash process to remove the photoresist layer 22 from a surface of the structure 10. This $O_2$ ash process involves ion bombardment, and this ion bombardment will convert the oxide layer 20a within active area 18 to a damaged oxide area 20b. The damaged layer 20b is damaged due to the ion bombardment needed to remove the photoresist layer 22 in a manner similar to the damage caused to exposed layers by low energy ion implantation. Following ash photoresist removal, an RCA substrate cleaning process is used to clean the surface of the active area 16. This RCA cleaning process involves oxide etch chemicals, such as HF, wherein a top surface of the layer 20b will be disadvantageously removed by the HF exposure. This removal of a portion of gate oxide layer 20b alone ensures that disadvantageous wafer-to-wafer gate oxide variations will be present. The oxide etch properties of the RCA clean also create addition problems within the structure 10. For example, the HF strip used in the RCA clean will not etch the layer 20b uniformly, thereby resulting in non-uniform distribution of oxide within the active area 18. This nonuniform distribution across a wafer and wafer-to-wafer adversely affects MOS on-current (Id), threshold voltage (Vt), leakage current, charge-to-break-down (Qbd) and like conventional MOSFET parameters. Generally, the ion bombardment from the $O_2$ ash and the oxide etch ambient from the RCA surface clean will result in substantial degradation of the quality of the oxide 20b in active area 18.

FIG. 4 illustrates that the entire wafer 10 is exposed to a thermal oxidation ambient to form a thin oxide layer 26 within active area 16. This oxidation slightly thickens the layer 20b in active area 18 to form a thickened oxide layer 20c. Due to the previous oxide bombardment damage and non-uniformity resulting within the layer 20b, the layer 20c is also non-uniform, damaged, and has compromised gate oxide integrity as discussed above. The lack of gate oxide integrity for layer 20c makes it is difficult to control MOS transistor performance in active area 18 both wafer-to-wafer and across a single wafer.

Due to the above concerns, there exists in the integrated circuit (IC) industry, a need for an IC manufacturing process which forms dual gate oxide regions of differing thickness on a same IC wafer without the problems illustrated and discussed with respect to FIGS. 1–4.

In addition to the process of FIGS. 1–4, the industry has used nitrogen ion implantation into substrate regions to create dual gate oxide devices. This process can be illustrated with respect to FIG. 1. In FIG. 1, the active area 16 can be selectively implanted with nitrogen atoms where active area 18 is masked from such an implant. Following this implant, a thermal oxidation is performed whereby the nitrogen incorporated into the active area 16 will retard thermal oxidation in that region 16. The result will be the formation of a thinner gate oxide region within active area 16 and a thicker gate oxide region with an active area 18. However, this process has some disadvantages. First, the scalability of the process to future technology is poor. In addition, the gate oxide integrity of the region 16 is significantly reduced according to experimental data, whereby the charge to breakdown (QBD) is adversely decreased. In addition, the obtainable ratio of thicknesses (e.g., thin gate ox thickness divided by thick gate oxide thickness) is inherently limited by physics to a limited range. This limited range of gate oxide differentials may create some artificial design limitations that may be problematic for certain IC designs.

Therefore, the nitrogen implantation scheme, now being investigated in the integrated circuitry industry is not believed to be entirely optimal for all purposes. Therefore, a need exists in the art to create a dual gate oxide process wherein both the thin and the thick gate oxide regions have improved gate oxide integrity, scalability, and flexibility.

Figure 1:
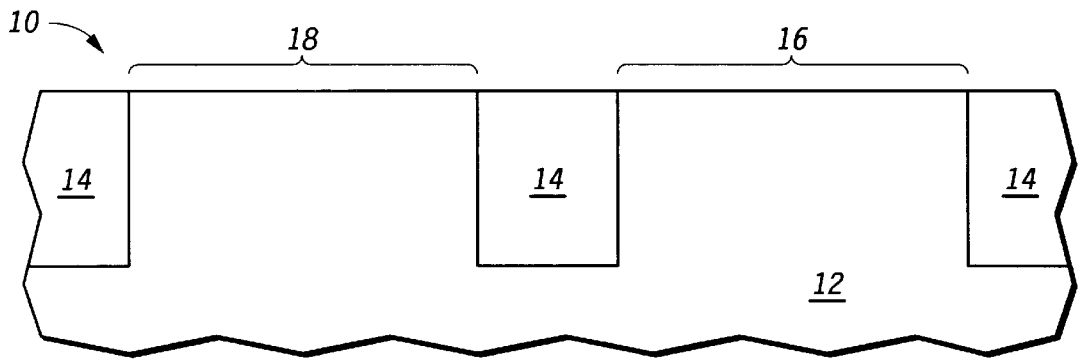
FIGS. 1–4 illustrate, in cross-section diagrams, a process for forming a dual gate structure that is known in the prior art.
Figure 2:
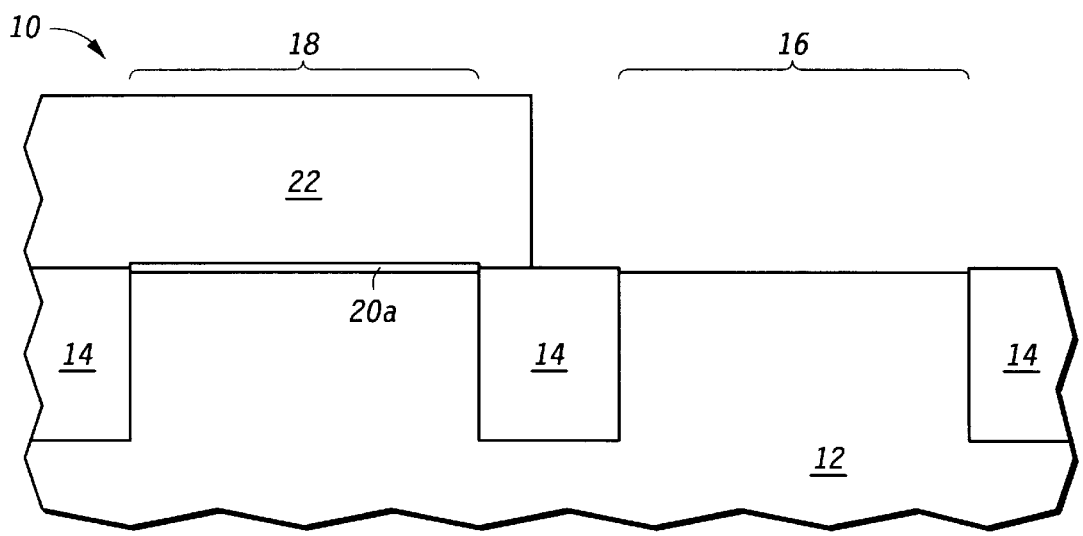
Figure 3:
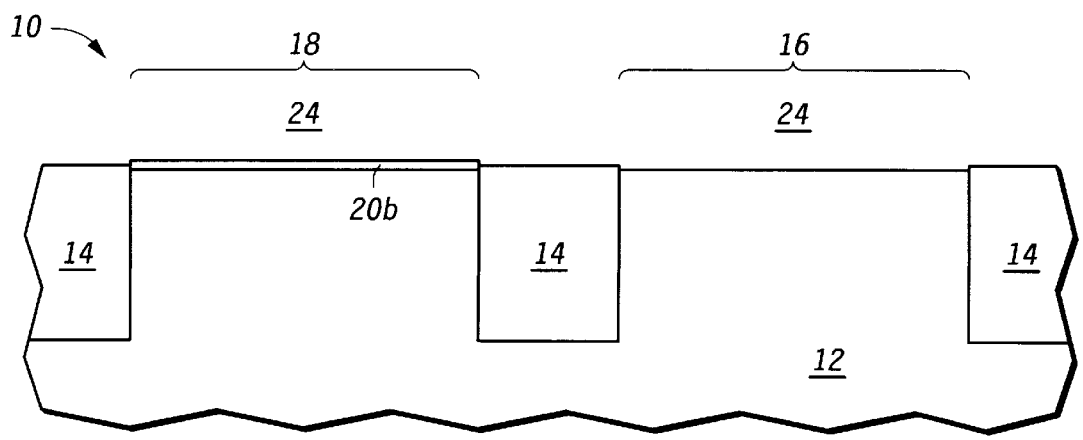
Figure 4:
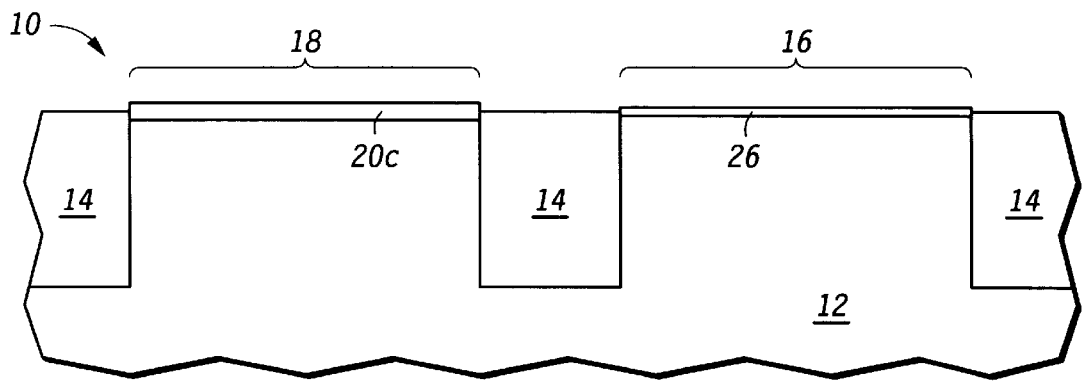

It will be appreciated that for simplicity and clarity of illustration, elements illustrated in the FIGURES have not necessarily been drawn to scale. For example, the dimensions of some of the elements are exaggerated relative to other elements for clarity. Further, where considered appropriate, reference numerals have been repeated among the FIGURES to indicate corresponding or analogous elements.

DESCRIPTION OF A PREFERRED EMBODIMENT

Generally, the present invention is a method for forming a dual gate oxide (DGO) structure to support two different gate oxide devices on a single integrated circuit (IC). The process begins by forming a first oxide layer over all active regions. This first oxide layer is capped with a protective layer, such as silicon oxynitride. A photoresist mask and etch process is then used to remove the nitride protection region and the first oxide layer from a first active area while leaving the first oxide layer in the nitride cap protection region in a second active area of the IC. The photoresist mask, used to perform this selective mask and removal process, is ashed off of the wafer. Exposed portions of the first active area are surface cleaned using conventional cleaning processes (e.g., RCA cleaning process). Due to the presence of the nitrogen cap, the underlying first oxide layer remaining in the second active area is protected against adverse damage and removal when performing the oxygen photoresist ash process and any RCA surface preparation of the first active area.

After the $O_2$ ash and the surface preparation processing, a second thermal oxidation process is used to form a second oxide within exposed active areas. The nitride capping layer over the first oxide layer ensures that substantial additional oxidation of the first oxide layer and/or the second active area is substantially suppressed or totally avoided. After the second oxidation is performed in the unprotected first active areas area to form a thinner gate oxide region, conductive gate electrodes are formed over the first active area and the second active area. Therefore, one MOS transistor formed in the first active area has a gate dielectric having a bottom portion made of the first oxide layer and a top portion made of the nitride protective capping layer, whereas a second MOS transistor formed in the second active area, has only the second dielectric layer as the gate dielectric material. Typically, the composite oxide/nitride gate dielectric of the first MOS transistor is thicker than the oxide-only gate dielectric of the second MOS transistor.

The process taught herein is improved over the prior art processes of FIGS. 1–4 since the uniformity of the gate oxide thickness resulting from the process taught herein is much improved over the uniformity of the dual gate oxide (DGO) thicknesses formed using the prior art processes. In addition, the process taught herein is far more scalable than processes used in the prior art. Most importantly, the process taught herein results in improved gate oxide integrity where charge to breakdown (Qbd), MOSFET on-current (Id), MOSFET threshold voltage (Vt), and like MOS device parameters have less standard deviation across a wafer and less standard deviation wafer-to-wafer. In addition, this improved gate oxide structure will also have a higher overall relative dielectric permittivity ($e_r$) which will improve MOS transistor performance.

The invention can be further understood with reference to FIGS. 5–14.

Figure 5:
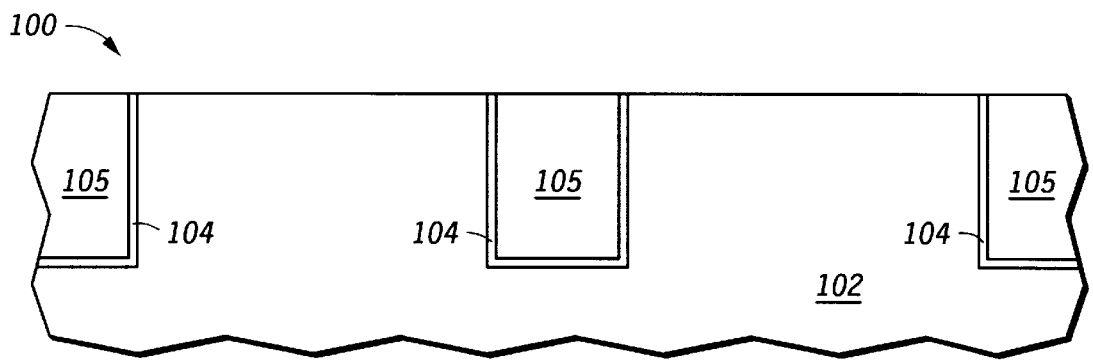
FIGS. 5–11, in cross-sectional diagrams, a method for forming an improved dual gate structure in accordance with the present invention.

FIGS. 5–11 illustrate a process that is improved over the prior art processes discussed with respect to FIGS. 1–4. FIG. 5 illustrates the beginning steps for forming a semiconductor structure 100. Semiconductor structure 100 contains a substrate 102. Preferably, the substrate 102 is a silicon substrate. However, the substrate 102 may be made of gallium arsenide, germanium, silicon-germanium, epitaxial formations, silicon carbide, composite materials such as indium phosphide, silicon-on-insulator substrates (SOI), and/or like semiconductor substrate materials. FIG. 5 illustrates that trench isolation regions are formed within the substrate 102. The trench isolation regions are formed by reactive ion etching trenches selectively within portions of the substrate 102. A liner 104 is then formed within the trench regions. Preferably, the liner layer 104 is a thin thermally grown silicon dioxide layer or an oxynitride layer. The bulk volume of the trenches are then filled with a dielectric fill material such as tetraethylorthosilicate (TEOS). This TEOS material is chemically-mechanically polished (CMPed) or planarized using a like procedure (e.g., resist etch back (REB)) to result in the trench structures illustrated in FIG. 5. It is important to note that other isolation schemes such as local oxidation of silicon (LOCOS), or polysilicon buffered (PBL) may be used in place of the trench isolation scheme shown in FIG. 5.

Figure 6:
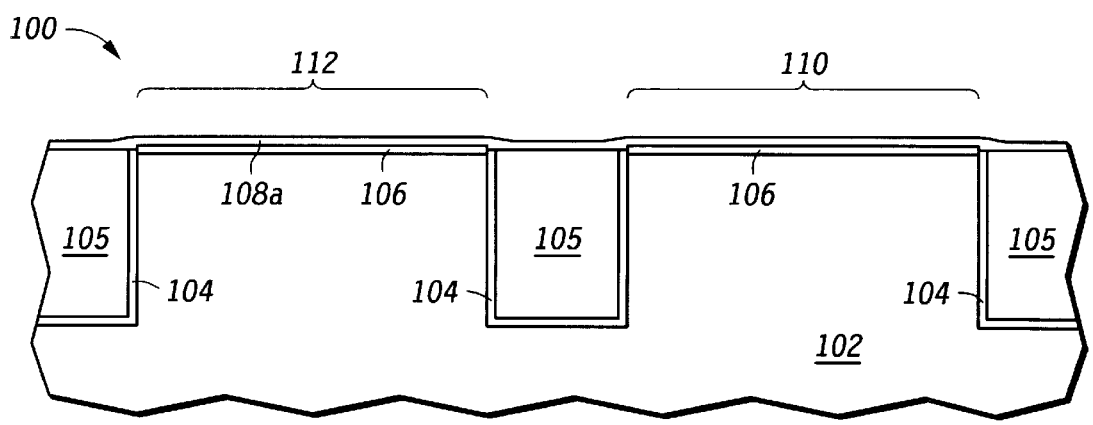

FIG. 6 illustrates that a thermal oxidation process is initiated to form a thermal silicon dioxide ($SiO_x$) layer 106 between the various trench regions 105 in FIG. 6. The layer 106 is formed both in an active region 110 and an active region 112 which are separated by trench isolation regions. The layer 106 is formed by a wet and/or dry thermal oxidation processing, and is preferably formed to a thickness substantially within a range of 50 angstroms to 240 angstroms.

The first thermal silicon dioxide layer 106 is then capped with a chemically vapor deposited (CVD) silicon nitride or oxynitride layer 108a. Preferably, a rapid thermal (RTCVD) process is used to form the layer 108a since RTCVD has been shown to form high integrity films that will not be degrading if incorporated into a gate electrode stack. However, a plasma enhanced chemical vapor deposition (PECVD) or a low pressure chemical vapor deposition (LPCVD) process may be used to form the layer 108a in FIG. 6. A preferable thickness range for the layer 108a lies within a range of roughly 10 angstroms to 50 angstroms with less than 40 angstroms being preferred.

When the layer 108a is formed as a nitrogen-rich silicon oxynitride layer, the layer 108a is formed by an RTCVD process using a silane (or a like silicon-containing gas source) along with an $NH_3$ gas with or without $N_2O$ coflow. Generally, the $N_2O$ source gas can be replaced with any other gas comprising one or more of oxygen and nitrogen. The result of using the source gases within the RTCVD process is the formation of the thin layer 108a illustrated in FIG. 6. After formation of this layer 108a, the layer 108a is exposed to an anneal ambient. Preferably, the anneal ambient is an $N_2$ ambient at a temperature greater than 700 degrees Celsius. Both the layer 108a formation step (using $NH_3/SiH_4/N_2O$) and the layer 108a annealing step (using $N_2$) may be done insitu in the same processing chamber. While silicon nitride or silicon oxynitride is taught herein as being the preferred material for layer 108a, generally, the layer 108a may be any material that can protect the underlying layer 106 from oxidation and that can be functionally incorporated into a gate dielectric stack by subsequent processing. The layer 108a is formed over both the active area 110 and 112 as shown in FIG. 6.

Figure 7:
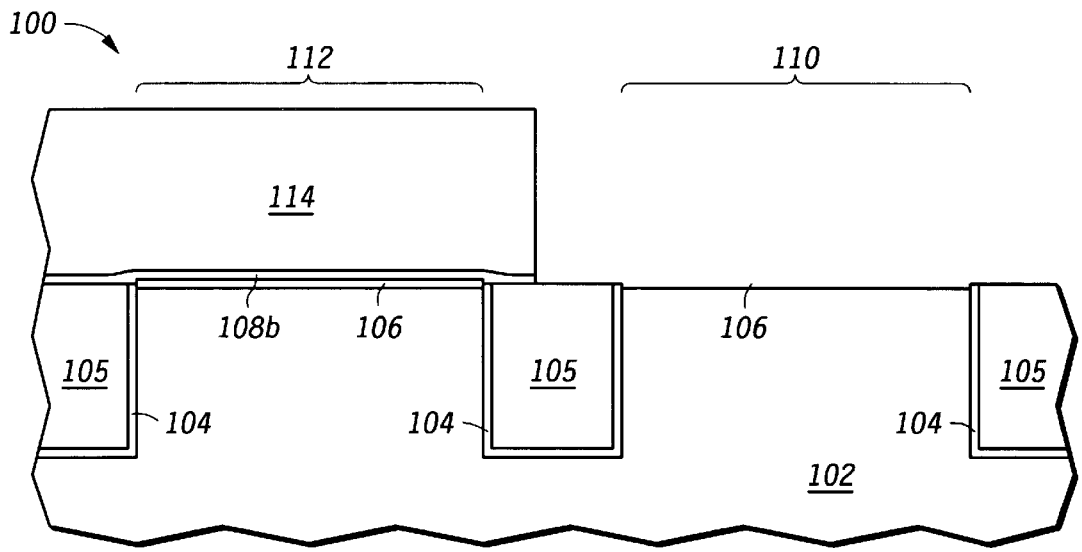

FIG. 7 illustrates that conventional photoresist processing is used to form a photoresist masking layer 114. The photoresist masking layer 114 will protect the layer 106 and layer 108a located within the active area 116 from subsequent processing and expose the nitride layer 108b and the oxide layer 106 lying within the active area 110 to such processing. A wet HF etch process is then used to remove the layer 108a and the layer 106 from the active area 110. This etch removal process results in a remaining nitride layer 108b lying only within the active area 116 over a portion of the oxide layer 106. In lieu of the wet processed taught herein, any combination of a wet or dry etch process may be used herein to remove the layer 108a and 106 from the active area 110 in FIG. 7.

Figure 8:
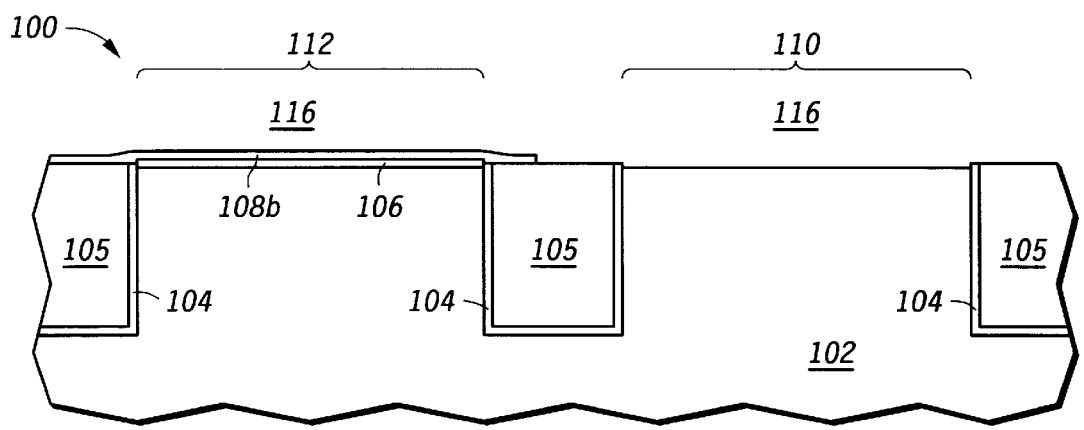

FIG. 8 illustrates that the photoresist layer 114 from FIG. 7 is $O_2$ ashed off a surface of the wafer by exposing the wafer to an ash environment 116. It is important to note that the $O_2$ ash environment 116 used in FIG. 8 will not adversely effect the layer 106 as previously discussed with respect to layer 20b of FIGS. 1–4. The nitride protection layer 108b will protect the underlying layer 106 from substantial ion bombardment damage during ashing. In addition, any ash process will not substantially effect the uniformity of the composite layer 106 and 108b.

After performing the ash operation in FIG. 8, the environment 116 is changed to a silicon surface cleaning process, such as an RCA clean. This RCA clean will substantially clean a surface of the active area 110 while the nitride protection layer 108b will protect underlying layer 106 from being substantially affected by any RCA, HF, or like surface cleaning process. While portions of the RCA clean will remove organic and heavy metal contaminates from a surface of active are 112, the HF portion of the RCA clean, while advantageous in region 110, is typically not advantageous for region 112. It is important to note that the protection layer 108b will protect the underlying layer 106 from any etching due to an ambient comprising HF or a like oxide etchant whereby the active area 110 may be properly prepared for oxide formation without damaging the existing oxide layer 106 in active area 112.

Figure 9:
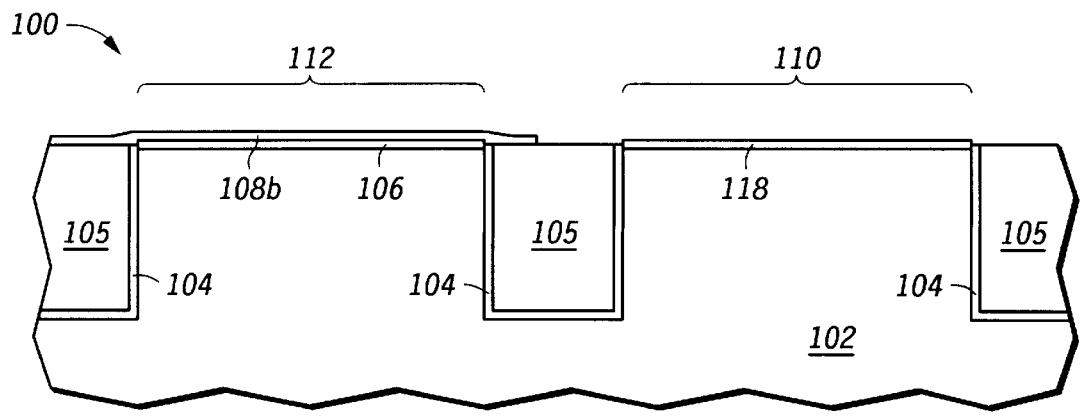

FIG. 9 illustrates that the semiconductor structure 100 is exposed to a thermal silicon dioxide oxidation ambient. This ambient forms a thin second silicon dioxide layer 118 over the active area 110. It is important to note that the layer 108b overlying the first silicon dioxide layer 106 in active area 112 substantially protects the active area 112 from any additional oxidation during this oxidation step. Since the layer 108b is relatively thin, a small amount of oxidation may occur within the active area 112, but such oxidation adds typically less than a few angstroms in thickness. Preferably, the thickness of the layer 118 lies substantially within a range of roughly 20 angstroms to 60 angstroms.

Figure 10:
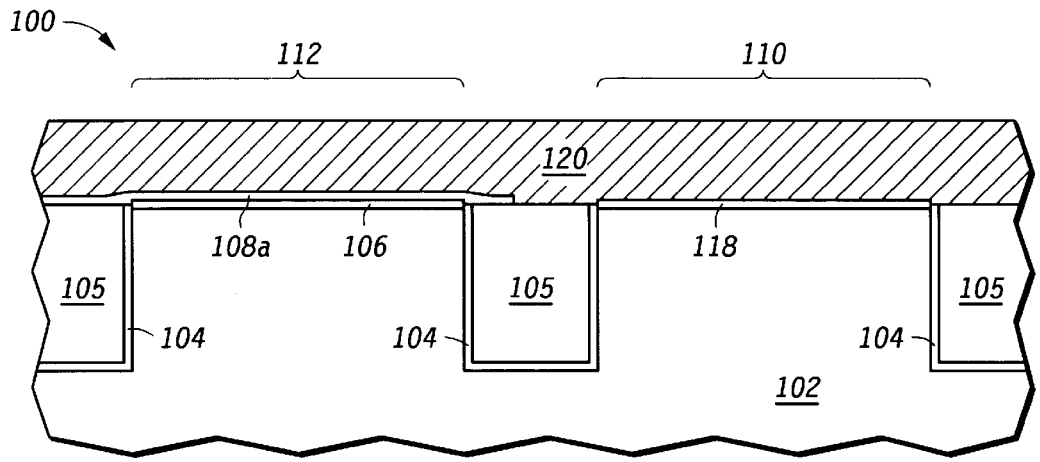

FIG. 10 illustrates that a conductive layer 120 is deposited over the active areas 112 and 110. In a preferred form, the layer 120 is polysilicon that may be optionally doped with one or more type of dopant atoms such as boron, phosphorous, antimony, arsenic, and the like. However, the layer 120 may be made of one or more of amorphous silicon, refractory metal compounds, metallic gate electrodes, silicided semiconductive gate regions, or like gate electrode materials. In addition, the layer 120 can be formed by depositing a plurality of polysilicon layers or a plurality of like conductive layers to form a composite gate structure.

Figure 11:
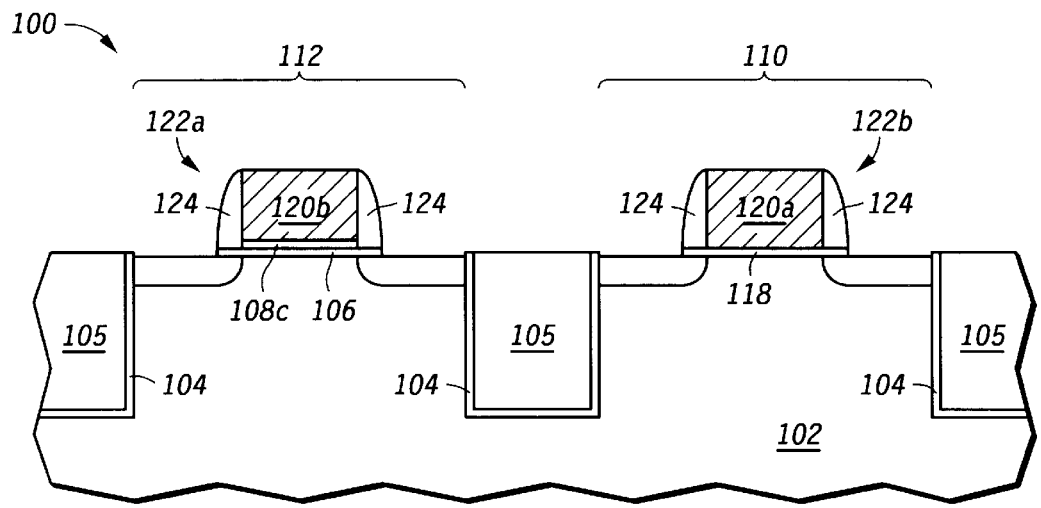

FIG. 11 illustrates that the polysilicon layer 120 from FIG. 10 is selectively etched using a photoresist masking and reactive ion etch (RIE) etch, plasma etch, or dry etch process. This etch process results in the formation of gate electrodes 120a and 120b as illustrated in FIG. 11. After formation of the gate electrode 120b, the nitride protection layer 108c is etched in a self-aligned manner to the gate 120b as illustrated in FIG. 11. Due to this etch process, all of the layer 108b not underlying the gate electrode portions or at least a substantial portion of these exposed regions of layer 108b are removed from the structure 100. Typical source and drain processing is then performed to form source and drain regions in FIG. 11 and form silicon nitride spacers 124 as illustrated in FIG. 11. The silicon nitride spacer 124 will overlie the silicon dioxide layer 106 and lie laterally adjacent the silicon nitride or oxynitride protection layer 108c. The result in FIG. 11 is the formation of MOS or CMOS devices 122a and 122b.

It is important to note that the gate dielectrics for the structures 122a and 122b in FIG. 11 are improved over the prior art processes discussed herein via FIGS. 1–4. The layers 106, 118, and 108c will have improved uniformity, improved scalability, and improved gate oxide integrity over prior art processes. In addition, since the layer 108c is a very thin silicon nitride or silicon oxynitride layer, any nitride stress induced on the underlying layer 106 is minimal or negligible and has not experimentally shown any disadvantageous effects. In addition, the process of FIGS. 5–11 is far more scalable and there is much more flexible control of the respective thicknesses of the various gate oxide regions. Also, the RTCVD process typically used to form the layer 108c forms a high quality material which is easily incorporated into gate dielectric materials without adverse consequences.

Figure 12:
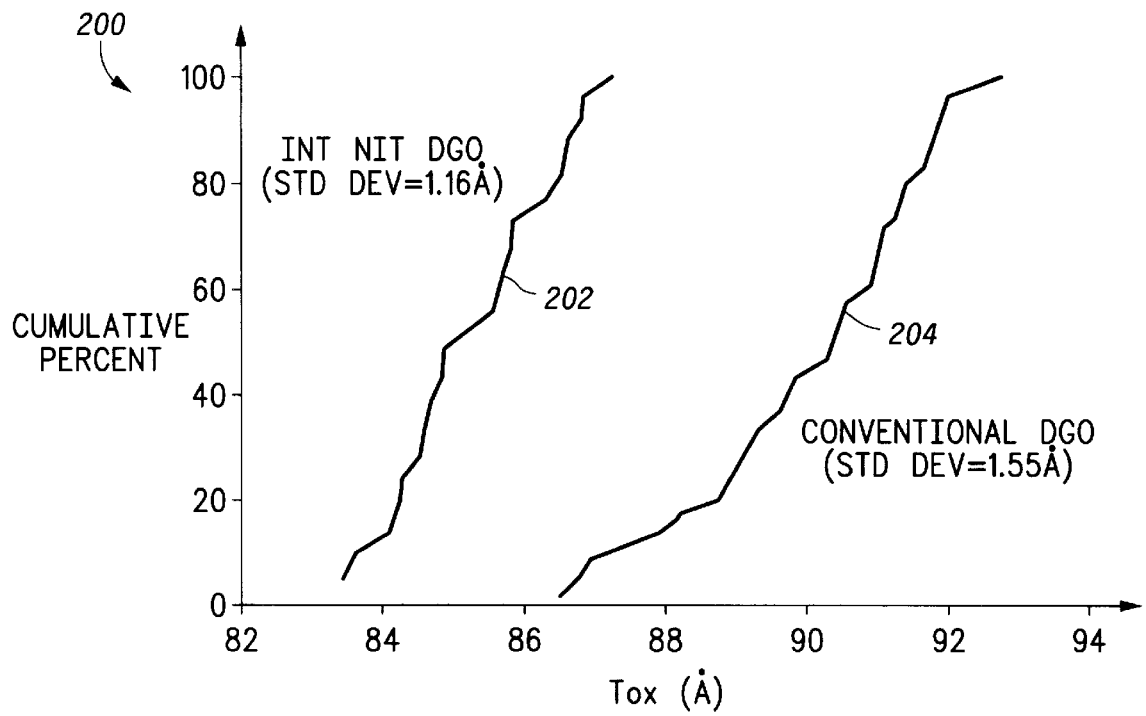
FIG. 12 illustrates, in an X-Y plot, a comparison of the uniformity of gate oxides formed in accordance with the prior art versus gate oxides formed in accordance with FIGS. 5–11.
Figure 13:
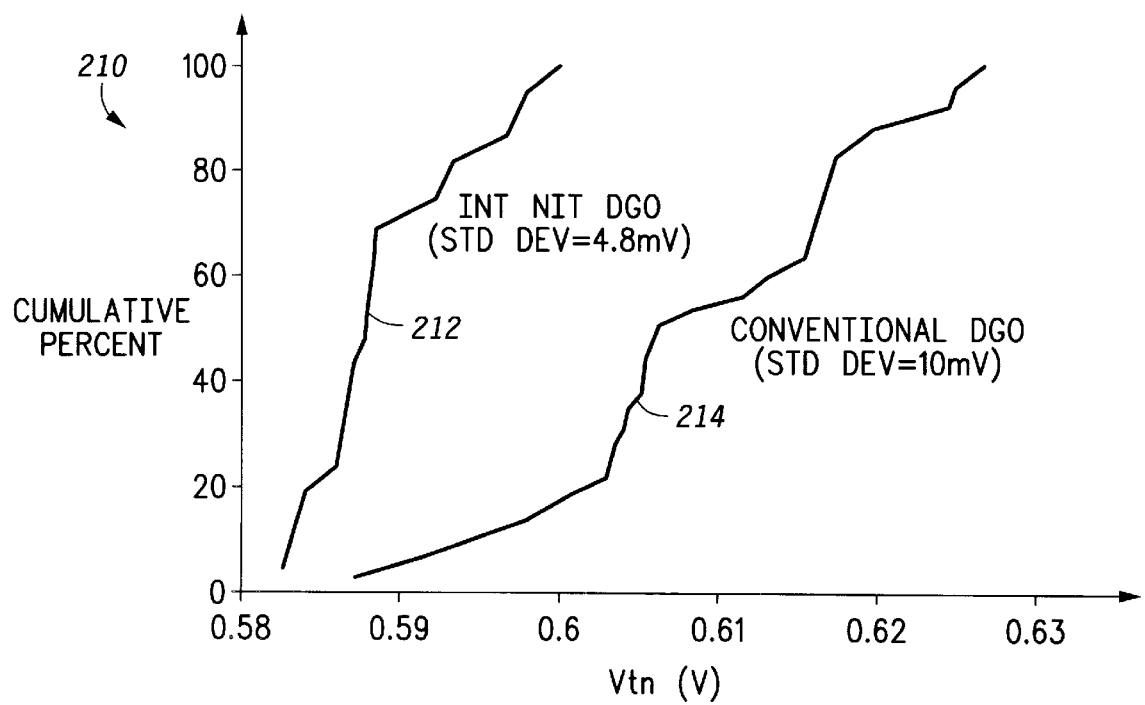
FIG. 13 illustrates, in an X-Y diagram, parameter uniformity of oxides formed using a prior art process versus an oxide formed using the process of FIGS. 5–11.
Figure 14:
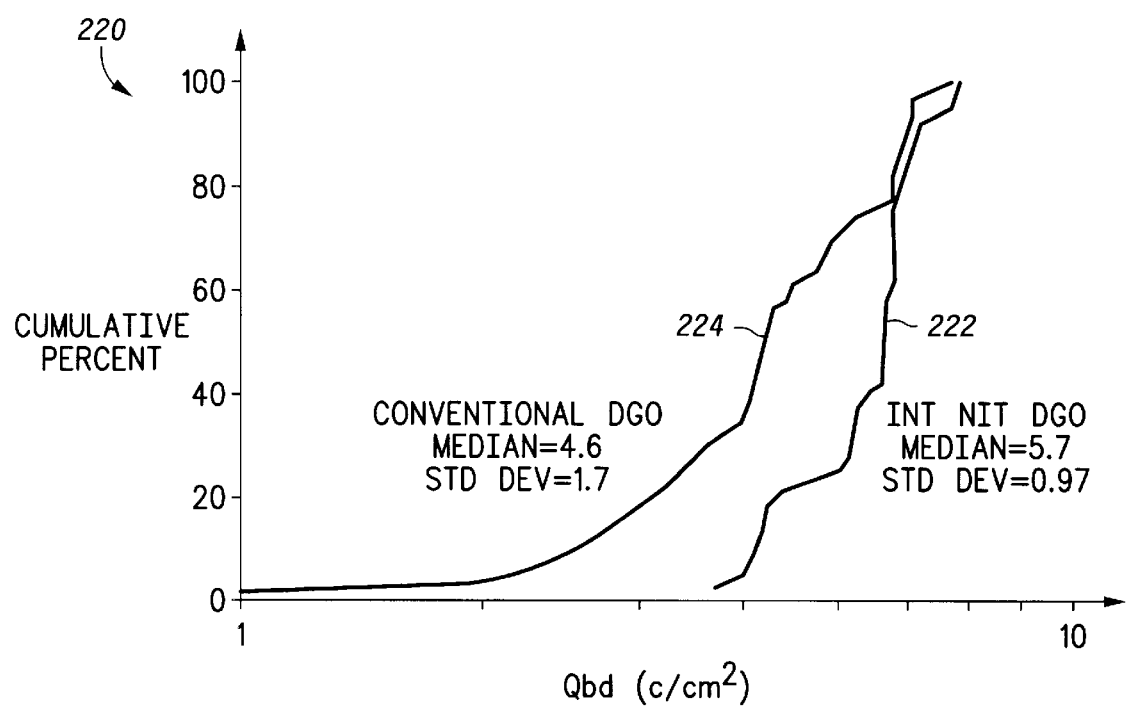
FIG. 14 illustrates, in an X-Y diagram, the improved charge to breakdown (Qbd) which results when using the process of FIGS. 5–11 in accordance with the present invention.

FIGS. 12–14 illustrate X-Y plots which show the improved uniformity and gate oxide integrity resulting when using the process of FIGS. 5–11 as compared to the prior art process of FIGS. 1–4.

Specifically, FIG. 12 illustrates an X-Y plot 200 of the thickness of the oxide (Tox) versus cumulative percent of devices that have that thickness or less. Specifically, FIG. 12 illustrates two data curves, 202 and 204. The data curve 202 in FIG. 12 illustrates the thickness (Tox) variation of the gate dielectric formed by layers 106 and 108c in FIG. 11. Plot 204 in FIG. 12 illustrates the thickness (Tox) variation of the layer 20c formed in prior art FIG. 4. As can clearly be seen by FIG. 12, the thickness of the gate dielectric is improved by 25% when using the process of FIGS. 5–11 as opposed to the prior art processing discussed with respect to FIGS. 1–4.

FIG. 13 illustrates an X-Y plot 210. Plot 210 illustrates threshold voltage (Vt) for an n-channel transistor versus cumulative percent of transistors that have that threshold voltage or less. FIG. 13 illustrates a data curve 212 and a data curve 214. The data curve 212 indicates a variation and n-channel threshold voltage (Vtn) which is experienced for the gate oxide composite 108c/106 when using the process of FIGS. 5–11. The threshold voltage plot 214 illustrates the variation in the n-channel threshold voltage (Vtn) when using the prior art layer 20c of FIG. 4 as a gate dielectric. As can be seen in FIG. 13, a 50% improvement in the distribution of the threshold voltage (Vt) can be obtained using the process of FIGS. 5–10 instead of the prior art process of FIGS. 1–4.

FIG. 14 illustrates an X-Y plot 220. Plot 220 graphs charge-to-breakdown (Qbd) versus cumulative percent of devices that obtain this Qbd value or a lesser Qbd value. FIG. 14 illustrates a first data curve 224 and a second data curve 222. The prior art gate dielectric 20c of FIG. 4 has a charge-to-breakdown Qbd distribution as illustrated by line 224 of FIG. 14. The composite gate dielectric 106/108c of FIG. 11 has a charge-to-breakdown Qbd distribution shown by line 222 in FIG. 14. As can be seen in FIG. 14, the charge-to-breakdown standard deviation is significantly reduced when using the process of FIGS. 5–11, and charge-to-breakdown values for MOS transistors can be improved on the order of 20%.

Although the invention has been described and illustrated with reference to specific embodiments, it is not intended that the invention be limited to those illustrative embodiments. Those skilled in the art will recognize that modifications and variations may be made without departing from the spirit and scope of the invention. Therefore, it is intended that this invention encompasses all the variations and modifications as fall within the scope of the appended claims.

What is claimed is:

1. A method for making a semiconductor structure, the method comprising the steps of:
    providing a substrate having a first active area and a second active area separated by an isolation region;
    forming a first oxide layer over both the first and second active areas;
    forming a protection layer over the first oxide layer;
    masking the protection layer overlying the first active area using a masking layer;
    etching the protection layer and the first oxide layer overlying the second active area while the masking layer protects the first oxide layer and the protection layer overlying the first active area;
    forming a second oxide layer overlying the second active area where the protection layer prevents a substantial oxidization in the first active area; and
    forming conductive gate electrodes over the first and second active areas wherein a composite of the protection layer and the first oxide layer forms a gate dielectric for conductive gate electrodes in the first active area and the second oxide layer forms a gate dielectric for conductive gate electrodes in the second active area.

2. The method of claim 1 further comprising the step of:
    etching the protection layer self-aligned to the conductive gate electrodes within the first active area so that portions of the protection layer not underlying the conductive gate electrodes within the first active area are removed.

3. The method of claim 1 wherein the second oxide layer is thinner than the first oxide layer.

4. The method of claim 1 wherein the step of etching the protection layer and the first oxide layer comprises:
    using a wet etch process and a dry etch process in sequential combination.

5. The method of claim 1 wherein protection layer is a silicon nitride layer formed by one of either PECVD, LPCVD, or RTCVD to a thickness of less than 40 Angstroms.

6. The method of claim 1 wherein the first oxide layer and the second oxide layer are silicon dioxide layers formed by thermal oxidation of substrate material.

7. The method of claim 1 wherein the step of etching the protection layer and the first oxide layer comprises:
    using only a wet etch process to remove the protection layer and the first oxide layer from the second active area.

8. The method of claim 1 wherein protection layer is an oxynitride layer formed by one of either PECVD, LPCVD, or RTCVD to a thickness of less than 40 Angstroms.

9. The method of claim 1 wherein the masking layer is formed as a photoresist layer and the method further comprises the steps of:
    exposing the photoresist layer to an ash process to remove the photoresist layer after the step of etching; and
    exposing a surface of the second active area to a wet clean process after the step of etching.

10. The method of claim 1 wherein the step of forming the protection layer comprises:
    exposing the semiconductor structure to an ambient comprising a silicon-containing gas and a nitrogen-containing gas to form the protection layer; and
    exposing the protection layer to an $N_2$ anneal ambient.

11. The method of claim 10 wherein both the steps of exposing are performed insitu in a single processing chamber.

12. A method for forming a semiconductor structure, the method comprising the steps of:
    providing a substrate having a first active area and a second active area separated by a trench isolation region;
    forming a first thermal silicon dioxide layer over both the first and second active areas to a thickness less than roughly 150 angstroms;
    forming a silicon oxynitride layer over first thermal silicon dioxide layer, the silicon oxynitride layer having a thickness of less than roughly 30 angstroms;
    masking the silicon oxynitride layer overlying the first active area using a photoresist masking layer;
    etching the silicon oxynitride layer and first thermal silicon dioxide layer overlying the second active area while the masking layer protects first thermal silicon dioxide layer and the silicon oxynitride layer overlying the first active area, said etching being performed by a wet chemistry comprising HF;
    removing the photoresist masking layer;
    cleaning a surface of the second active area;
    forming a second thermal silicon dioxide layer overlying the second active area; and
    forming conductive gate electrodes over the first and second active areas wherein a composite of the silicon oxynitride layer and the first thermal silicon dioxide layer forms a gate dielectric for conductive gate electrodes in the first active area and the second thermal silicon dioxide layer forms a gate dielectric for conductive gate electrodes in the second active area.

13. The method of claim 12 wherein silicon oxynitride layer is formed by one of either PECVD, LPCVD, or RTCVD.

14. The method of claim 12 wherein the step of forming the silicon oxynitride layer comprises:
    exposing the semiconductor structure to an ambient comprising a silicon-containing gas and $NH_3$ to form the silicon oxynitride layer; and exposing the silicon oxynitride layer to an $N_2$ anneal ambient.

15. The method of claim 14 wherein both the steps of exposing are performed insitu in a single processing chamber.

16. The method of claim 12 wherein the second thermal silicon dioxide layer is thinner than the first thermal silicon dioxide layer.

17. A method for forming a semiconductor structure, the method comprising the steps of:

providing a substrate having a first active area and a second active area;

forming a first MOS transistor within the first active area, the first MOS transistor having a composite gate dielectric where a bottom portion of the composite gate dielectric is a thermally grown oxide material having a first thickness and a top portion of the composite gate dielectric is a silicon oxynitride material;

forming a second MOS transistor within the second active area, the second MOS transistor having a gate dielectric layer comprised of only oxide material of a second thickness wherein the first thickness is greater than the second thickness; and forming a sidewall spacer over a portion of the thermally grown oxide material and laterally adjacent the silicon oxynitride material.

18. The method of claim 17 wherein the silicon oxynitride material is formed by an RTCVD process.

19. The method of claim 17 wherein the sidewall spacer is a nitride sidewall spacer.

20. The method of claim 17 wherein the silicon oxynitride material is formed by exposing, in a chamber, the semiconductor structure to an ambient comprising a silicon-containing gas, $NH_3$, and $N_2O$ to form the silicon oxynitride material, and exposing the silicon oxynitride material to an $N_2$ anneal ambient insitu within the chamber.

* * * * *